United States Patent
Hanamoto et al.

(10) Patent No.: US 9,000,664 B2
(45) Date of Patent: *Apr. 7, 2015

(54) PHOSPHOR PARTICLE GROUP, LIGHT EMITTING APPARATUS USING THE SAME, AND LIQUID CRYSTAL DISPLAY TELEVISION

(75) Inventors: Tetsuya Hanamoto, Osaka (JP); Masatsugu Masuda, Osaka (JP); Kenji Terashima, Osaka (JP); Hideyuki Emoto, Machida (JP); Hironori Nagasaki, Machida (JP)

(73) Assignees: Sharp Kabushiki Kaisha, Osaka-shi (JP); Denki Kagaku Kogyo Kabushiki Kaisha, Tokyo (JP)

( * ) Notice: Subject to any disclaimer, the term of this patent is extended or adjusted under 35 U.S.C. 154(b) by 653 days.

This patent is subject to a terminal disclaimer.

(21) Appl. No.: 13/263,053

(22) PCT Filed: Apr. 2, 2010

(86) PCT No.: PCT/JP2010/056073
§ 371 (c)(1),
(2), (4) Date: Oct. 5, 2011

(87) PCT Pub. No.: WO2010/116953
PCT Pub. Date: Oct. 14, 2010

(65) Prior Publication Data
US 2012/0026426 A1  Feb. 2, 2012

(30) Foreign Application Priority Data
Apr. 6, 2009 (JP) ................. 2009-092253

(51) Int. Cl.
C09K 11/64 (2006.01)
C09K 11/78 (2006.01)
(Continued)

(52) U.S. Cl.
CPC ......... *C09K 11/7734* (2013.01); *C09K 11/0883* (2013.01); *H05B 33/14* (2013.01); *H01L 33/502* (2013.01)

(58) Field of Classification Search
CPC ........... C09K 11/7734; C09K 11/0883; H01L 33/502
USPC ............. 313/501, 53, 503, 512; 252/301.4 R; 349/71
See application file for complete search history.

(56) References Cited

U.S. PATENT DOCUMENTS 7,833,436 B2   11/2010   Shimooka et al.
8,084,942 B2 * 12/2011   Hanamoto et al. ............ 313/512
(Continued)

FOREIGN PATENT DOCUMENTS

CN   101821356   9/2010
EP   1 854 864   11/2007
(Continued)

OTHER PUBLICATIONS

Masuda et al., Notice of Allowance mailed Oct. 17, 2013, directed to U.S. Appl. No. 11/944,052; 11 pages.
(Continued)

*Primary Examiner* — Karabi Guharay
(74) *Attorney, Agent, or Firm* — Morrison & Foerster LLP (57) ABSTRACT

Provided is a phosphor particle group of divalent europium-activated oxynitride green light emitting phosphor particles each of which is a β-type SiAlON represented by a general formula: $Eu_aSi_bAl_cO_dN_e$, where $0.005 \leq a \leq 0.4$, $b+c=12$, $d+e=16$, wherein a mean value of a value obtained by dividing a longer particle diameter by a shorter particle diameter is not greater than 1.75. Also provided are a light emitting apparatus using the phosphor particle group in a light converter, and a liquid crystal display television using the light emitting apparatus. With these, a high-efficiency and stable light emitting apparatus using a β-type SiAlON, and a phosphor particle group therefor are provided.

11 Claims, 2 Drawing Sheets (51) Int. Cl.
  *H01L 33/50* (2010.01)
  *C09K 11/77* (2006.01)
  *C09K 11/08* (2006.01)
  *H05B 33/14* (2006.01)

(56) References Cited

U.S. PATENT DOCUMENTS

| | | | | |
|---|---|---|---|---|
| 2001/0001207 | A1* | 5/2001 | Shimizu et al. | 257/98 |
| 2002/0039002 | A1* | 4/2002 | Fukasawa et al. | 313/512 |
| 2004/0000868 | A1* | 1/2004 | Shimizu et al. | 313/512 |
| 2004/0012027 | A1 | 1/2004 | Keller et al. | |
| 2007/0012931 | A1 | 1/2007 | Lee et al. | |
| 2007/0108896 | A1 | 5/2007 | Hirosaki | |
| 2009/0021141 | A1 | 1/2009 | Emoto et al. | |
| 2009/0129052 | A1 | 5/2009 | Hirosaki | |
| 2009/0153028 | A1 | 6/2009 | Hirosaki | |
| 2010/0213820 | A1 | 8/2010 | Sakai et al. | |
| 2012/0305844 | A1 | 12/2012 | Emoto et al. | |

FOREIGN PATENT DOCUMENTS

| | | |
|---|---|---|
| EP | 1884552 | 2/2008 |
| EP | 1964905 A1 * | 9/2008 |
| EP | 2 022 835 | 2/2009 |
| JP | 2005-3436 | 1/2005 |
| JP | 2005-255895 | 9/2005 |
| JP | 2007-332324 | 12/2007 |
| KR | 10-2007-0106507 | 11/2007 |
| WO | WO-2006/093135 | 9/2006 |
| WO | WO-2007/142289 | 12/2007 |
| WO | WO-2008/062781 | 5/2008 |
| WO | WO-2009/008250 | 1/2009 |
| WO | WO-2009/048150 | 4/2009 |

OTHER PUBLICATIONS

Hanamoto et al., Notice of Allowance mailed Nov. 19, 2013, directed to U.S. Appl. No. 13/303,907; 10 pages.

Masuda et al., Notice of Allowance mailed Dec. 13, 2013, directed to U.S. Appl. No. 13/500,803; 9 pages.

International Search Report mailed May 11, 2010, directed to International Application No. PCT/JP2010/056073; 4 pages.

Hirosaki et al. (May 17, 2005). "Characterization and properties of green-emitting β-SiAlON : $Eu^{2+}$ powder phosphors for white light-emitting diodes," *Applied Physics Letters*, AIP. 86(21); pp. 211905-1 to 211905-3.

Ryu et al. (Jan. 1, 2008). "Luminescent properties of β-SiAlON : Eu2+ green phosphors synthesized by gas pressured sintering," *Journal of the Ceramic Society of Japan*. 116(1351); pp. 389-394.

Search Report mailed Aug. 22, 2012, directed to European Application No. 10761652.6; 6 pages.

Masuda, M. et al., U.S. Office Action mailed Jul. 30, 2013, directed to U.S. Appl. No. 13/729,191; 7 pages.

Masuda et al., Office Action mailed Apr. 5, 2013, directed to U.S. Appl. No. 11/944,052; 18 pages.

Hanamoto et al., U.S. Office Action mailed Apr. 28, 2014, directed to U.S. Appl. No. 14/176,442; 7 pages.

Masuda et al., U.S. Office Action mailed Feb. 3, 2014, directed to U.S. Appl. No. 13/729,191; 7 pages.

Masuda et al., U.S. Notice of Allowance mailed Mar. 20, 2014, directed to U.S. Appl. No. 13/729,191; 7 pages.

Masuda et al., U.S. Office Action mailed Sep. 22, 2014, directed to U.S. Appl. No. 14/470,153; 5 pages.

Hanamoto et al., U.S. Office Action mailed Oct. 30, 2014, directed to U.S. Appl. No. 14/176,442; 7 pages.

U.S. Appl. No. 11/994,052, filed Nov. 21, 2007.

U.S. Appl. No. 13/500,803, filed Apr. 6, 2012.

* cited by examiner

PHOSPHOR PARTICLE GROUP, LIGHT EMITTING APPARATUS USING THE SAME, AND LIQUID CRYSTAL DISPLAY TELEVISION

REFERENCE TO RELATED APPLICATIONS

This application is a national stage application under 35 USC 371 of International Application No. PCT/JP2010/056073, filed Apr. 2, 2010, which claims the priority of Japanese Patent Application No. 2009-092253, filed Apr. 6, 2009, the contents of both of which prior applications are incorporated herein by reference.

FIELD OF THE INVENTION

The present invention relates to a particle group of phosphor particles (phosphor particle group) suitable for light emitting apparatus, a light emitting apparatus using the same in a light converter, and a liquid crystal display television.

BACKGROUND OF THE INVENTION

A light emitting apparatus using a combination of semiconductor light emitting elements and phosphors attracts attention as a next generation light emitting apparatus expected to realize low power consumption, compact size, high intensity, high color gamut, and high color rendition, and is actively researched and developed. Primary light emitted from a light emitting element in a range from the longer ultraviolet to the visible blue, i.e. 380-480 nm, is usually used. A light converter using various phosphors suitable for this application is also proposed.

At present, as a white light emitting apparatus of this type, a combination of a light emitting element emitting blue light (peak wavelength: around 460 nm) and a trivalent cerium-activated $(Y, Gd)_3(Al, Ga)_5O_{12}$ phosphor or a divalent europium-activated $2(Sr, Ba, Ca)O \cdot SiO_2$ phosphor, which is excited by the blue light and emits yellow light, is mainly used. However, color gamut (NTSC ratio) of a color liquid crystal display (LCD) using such a light emitting apparatus is about 70%, although higher color gamut is required in compact LCD.

Furthermore, for the light emitting apparatus of this type, an attempt has recently been made not only to improve luminous efficiency (brightness) but also to increase input energy to achieve higher brightness. When input energy is increased, it becomes necessary to effectively dissipate the heat of the entire light emitting apparatus including the light converter. For achieving this, the development of the entire structure and materials of light emitting apparatus has been pursued. However, a temperature rise in the light emitting element and the light converter during operation is still inevitable.

However, in the trivalent cerium-activated $(Y, Gd)_3(Al, Ga)_5O_{12}$ phosphor, in particular, there is a technical problem in that it is impossible to set input energy at high status, because the luminance at 100° C. decreases to about 85%, compared to the luminance (brightness) of 100% at 25° C. Therefore, it is urgently necessary to improve the temperature characteristic of phosphors to be used for the light emitting apparatus of this type.

For these technical problems, it is known that the use of a divalent europium-activated oxynitride green light emitting phosphor which is β-type SiAlON represented by $Eu_aSi_bAl_cO_dN_e$ results in a light emitting apparatus having good color gamut (NTSC ratio) and temperature characteristic.

However, the divalent europium-activated oxynitride green light emitting phosphor which is β-type SiAlON is basically a columnar crystal, and as for a group of phosphor particles (phosphor particle group), a phosphor with a value obtained by dividing a longer particle diameter by a shorter particle diameter exceeding five is easily produced. The use of a phosphor particle group including a large number of particles with the value obtained by dividing a longer particle diameter by a shorter particle diameter exceeding five has a technical problem in that when the phosphor particle group is dispersed in a resin, such a phenomenon as aggregation which is assumed to be attributable to the form factor takes place to prevent uniform dispersion, and a good characteristic (brightness) cannot be obtained.

Therefore, it is urgently necessary to develop a divalent europium-activated oxynitride green light emitting phosphor particle which is a β-type SiAlON represented by $Eu_aSi_bAl_cO_dN_e$ having a controlled shape, and a high-efficiency light emitting apparatus using the same. Japanese Patent Laying-Open No. 2005-255895 (Patent Literature 1), for example, discloses β-type SiAlON in which a mean value of the aspect ratio (the value obtained by dividing the length of the longer axis of a particle by the length of the shorter axis) is 1.5 or more and 20 or less. However, in the examples of Patent Literature 1, the aspect ratio of the phosphor particle in each example is not disclosed, and no mention is made to the aspect ratio and the characteristic. Furthermore, Patent Literature 1 only shows a columnar shape (photograph) in FIG. 2.

Furthermore, WO2009/008250A1 (Patent Literature 2) discloses a β-type SiAlON and a phosphor particle group characterized in that 60% or more of the phosphor particle group is composed of the phosphor particles with the aspect ratio being greater than 1.0 and not greater than 3.0. Patent Literature 2 discloses that significant enhancement of brightness is achieved, compared to conventional products.

However, more excellent color gamut than that of conventional cold cathode tubes has recently been expected for application to a large LCD such as a thin-screen television. Therefore, further stabilization of the characteristic (fluctuations in brightness and chromaticity) is also desired in the above-noted phosphor particle group and the light emitting apparatus using the same.

CITATION LIST

Patent Literature

PTL 1: Japanese Patent Laying-Open No. 2005-255895
PTL2: WO2009/008250A1

SUMMARY OF INVENTION

Technical Problem

The present invention is made to solve the aforementioned problems. An object of the present invention is to provide a high-efficiency and stable-in-characteristic light emitting apparatus using a p-type SiAlON and a phosphor particle group therefor.

Solution to Problem

As a result of elaborate investigation, study and development for solving the aforementioned problems, the present inventors have found that it is possible to obtain a light emitting apparatus having significantly smaller fluctuations in characteristic (brightness and chromaticity) than those of conventional light emitting apparatus, by using a particle group of β-type SiAlON having a crystal shape controlled more strictly than those of conventional particles. More specifically, the present invention is as follows.

A phosphor particle group in accordance with the present invention is a particle group of divalent europium-activated oxynitride green light emitting phosphor particles each of which is a β-type SiAlON represented by a general formula (I): $Eu_aSi_bAl_cO_dN_e$, where $0.005 \le a \le 0.4$, $b+c=12$, $d+e=16$, wherein a mean value of a value obtained by dividing a longer particle diameter by a shorter particle diameter is not greater than 1.75.

Preferably, in the phosphor particle group of the present invention, the phosphor particles in which a value obtained by dividing a longer particle diameter by a shorter particle diameter is greater than 1.0 and not greater than 2.0 constitute 60% or more of the whole phosphor particles.

More preferably, in the phosphor particle group of the present invention, the phosphor particles in which a value obtained by dividing a longer particle diameter by a shorter particle diameter is greater than 1.0 and not greater than 2.0 constitute 80% or more of the whole phosphor particles.

Preferably, in the phosphor particle group of the present invention, $c \ge 0.3$ in the general formula (I).

Preferably, in the phosphor particle group of the present invention, $0.01 \le a \le 0.2$ in the general formula (I).

Preferably, the phosphor particle group of the present invention has a median diameter in a range of 10-25 μm.

The present invention also provides a light emitting apparatus including: a light emitting element of a gallium nitride-based semiconductor emitting primary light having a peak wavelength of 430-480 nm; and a light converter absorbing a part of the primary light to emit secondary light having a wavelength longer than a wavelength of the primary light. The light converter includes a phosphor particle group of divalent europium-activated oxynitride green light emitting phosphor particles each of which is β-type SiAlON represented by a general formula (I): $Eu_aSi_bAl_cO_dN_e$, where $0.005 \le a \le 0.4$, $b+c=12$, $d+e=16$, wherein a mean value of a value obtained by dividing a longer particle diameter by a shorter particle diameter is not greater than 1.75.

Preferably, in the light emitting apparatus of the present invention, the phosphor particles in which a value obtained by dividing a longer particle diameter by a shorter particle diameter is greater than 1.0 and not greater than 2.0 constitute 60% or more of the whole phosphor particles of the phosphor particle group.

More preferably, in the light emitting apparatus of the present invention, the phosphor particles in which a value obtained by dividing a longer particle diameter by a shorter particle diameter is greater than 1.0 and not greater than 2.0 constitute 80% or more of the whole phosphor particles of the phosphor particle group.

Preferably, in the light emitting apparatus of the present invention, the phosphor particle group with $c \ge 0.3$ in the general formula (I) is used.

Preferably, in the light emitting apparatus of the present invention, the phosphor particle group with $0.01 \le a \le 0.2$ in the general formula (I) is used.

Preferably, in the light emitting apparatus of the present invention, a median diameter of the phosphor particle group is in a range of 10-25 μm.

The present invention also provides a liquid crystal display television using each light emitting apparatus of the present invention as described above.

Advantageous Effects of Invention

In accordance with the present invention, it is possible to provide a light emitting apparatus having an extremely stable characteristic (brightness and chromaticity), capable of efficiently absorbing primary light from a light emitting element and yielding white light with high efficiency, excellent color gamut (NTSC ratio) and a good temperature characteristic, and a phosphor particle group suitably used in the same. Such a light emitting apparatus of the present invention is suitably applicable to a liquid crystal display television having a large LCD such as a thin-screen television.

DETAILED DESCRIPTION OF THE INVENTION

A phosphor particle group of the present invention is composed of particles of a divalent europium-activated oxynitride green light emitting phosphor which is a β-type SiAlON represented by the following general formula (I):

$$Eu_aSi_bAl_cO_dN_e \quad \text{general formula (I):}$$

where the value of "a" is $0.005 \le a \le 0.4$, $b+c=12$, and $d+e=16$. In the general formula (I), if the value of "a" is less than 0.005, inconveniently, sufficient brightness cannot be obtained, and if the value of "a" exceeds 0.4, inconveniently, brightness significantly reduces due to concentration quenching and the like. In terms of stability of the characteristic and host crystal homogeneity, the value of "a" in the general formula (I) is preferably $0.01 \le a \le 0.2$.

Specifically, examples of the divalent europium-activated oxynitride green light emitting phosphor which is a β-type SiAlON represented by the general formula (I) are
$Eu_{0.05}Si_{11.50}Al_{0.50}O_{0.30}N_{15.70}$,
$Eu_{0.10}Si_{11.00}Al_{1.00}O_{0.40}N_{15.60}$,
$Eu_{0.30}Si_{9.80}Al_{2.20}O_{1.00}N_{15.00}$,
$Eu_{0.15}Si_{10.00}Al_{2.00}O_{0.50}N_{15.50}$,
$Eu_{0.01}Si_{11.60}Al_{0.40}O_{0.20}N_{15.80}$,
$Eu_{0.005}Si_{11.70}Al_{0.30}O_{0.15}N_{15.85}$,
$Eu_{0.25}Si_{11.65}Al_{0.35}O_{0.30}N_{15.70}$,
$Eu_{0.40}Si_{11.35}Al_{0.65}O_{0.35}N_{15.65}$, and the like. The present invention is, however, not limited thereto, as a matter of course.

Figure 1:
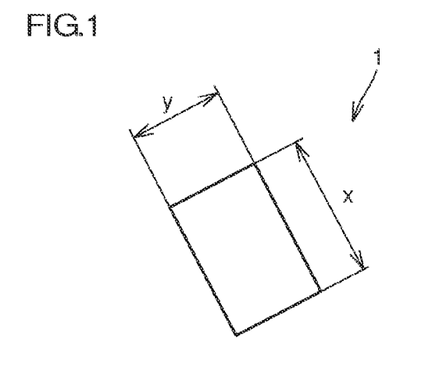
FIG. 1 is a diagram schematically showing a phosphor particle 1 included in a phosphor particle group of the present invention.

Here, FIG. 1 is a diagram schematically showing a phosphor particle 1 included in the phosphor particle group in accordance with the present invention. The phosphor particle group of the present invention is characterized in that a mean value of the value (aspect ratio) obtained by dividing the longer particle diameter x (a linear distance along the longer axis) by the shorter particle diameter y (a linear distance along the shorter axis) is not greater than 1.75. According to such a phosphor particle group of the present invention, significant enhancement of brightness can be achieved in a light emitting apparatus using the same.

The above-noted mean value of the value obtained by dividing the longer particle diameter by the shorter particle diameter can be obtained by automatically performing imaging, measurement and calculation using a particle size and shape distribution measuring instrument (PITA-1 manufactured by Seishin Enterprise Co., Ltd.) including an optical microscope and a CCD camera.

Preferably, the phosphor particles with the value obtained by dividing the longer particle diameter by the shorter particle diameter being greater than 1.0 and not greater than 2.0 constitute 60% or more of the whole phosphor particles of the phosphor particle group of the present invention. If the aspect ratio is greater than 1.0 and not greater than 2.0, a light emitting apparatus having small fluctuations in brightness and chromaticity and having extremely stable characteristic (brightness and chromaticity) can be obtained. If the phosphor particles with the value obtained by dividing the longer particle diameter by the shorter particle diameter being greater than 1.0 and not greater than 2.0 constitute less than 60% of the phosphor particle group, the phosphor particles cannot be dispersed finely and uniformly in a light converter (as described later) of a light emitting apparatus using such a phosphor particle group, and therefore, it becomes difficult to obtain a light emitting apparatus having a stable characteristic (brightness and chromaticity). The phosphor particles with the value obtained by dividing the longer particle diameter by the shorter particle diameter being greater than 1.0 and not greater than 2.0 more preferably constitute 80% or more of the phosphor particle group and particularly preferably constitute 90% or more, since it is possible to build a good light converter in which phosphor particles are dispersed very finely and uniformly, and to realize a light emitting apparatus having an extremely stable characteristic.

It is noted that the value obtained by dividing the longer diameter by the shorter diameter of the phosphor particle included in the above-mentioned phosphor particle group can be measured, for example, using a scanning electron microscope (SEM) or an optical microscope. The proportion of those phosphor particles with the value obtained by dividing the longer particle diameter by the shorter particle diameter being greater than 1.0 and not greater than 2.0, which are included in the phosphor particle group, can also be measured, for example, using a scanning electron microscope (SEM) or an optical microscope.

In order to obtain a light emitting apparatus having a stable characteristic (brightness and chromaticity) in the present invention, the median diameter (D50) of the phosphor particle group is preferably in the range of 10-25 µm and more preferably in the range of 13-20 µm. If the median diameter of the phosphor particle group of the present invention is less than 10 µm, crystal growth is insufficient, and it may be impossible to obtain sufficient brightness and stability of chromaticity in the light emitting apparatus using such a phosphor particle group. On the other hand, if greater than 25 µm, it may be difficult to build a light converter in which phosphor particles having the aspect ratio of the present invention are uniformly dispersed. It is noted that the above-noted median diameter (D50) refers to a value measured using a particle size distribution measuring equipment (LA-920 manufactured by HORIBA, Ltd.).

The phosphor particle group of the present invention can be produced by any conventionally-known appropriate method, except that the phosphor particles in which the value obtained by dividing the longer particle diameter by the shorter particle diameter is greater than 1.0 and not greater than 2.0 constitute 60% or more of the whole phosphor particles. As for the phosphor particles that constitute 60% or more of the phosphor particle group of the present invention, as one method of controlling the value obtained by dividing the longer diameter by the shorter diameter of the phosphor particle such that it is greater than 1.0 and not greater than 2.0, an Al concentration (a value of "c" in the general formula (I)) is set to 0.3 or more, and as a result, the desired phosphor particle group can be obtained with comparative ease. In addition to this method, the method includes, for example, accurately controlling an oxygen concentration, accurately controlling the density and volume of raw materials in a firing container, optimizing a temperature profile at a time of synthesis, or the like. The present invention is, however, not limited to those methods described above.

Figure 2:
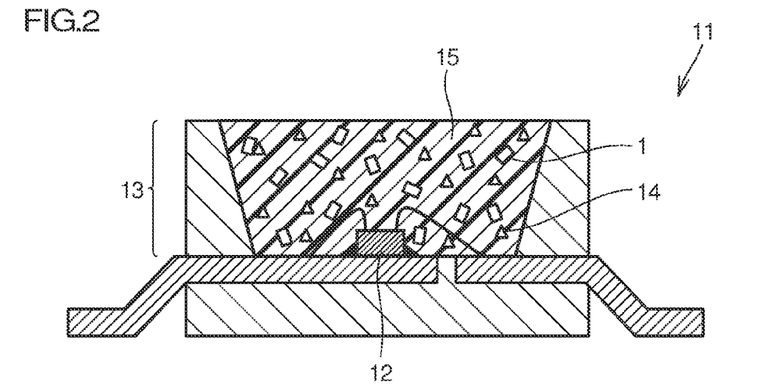
FIG. 2 is a cross-sectional view schematically showing a light emitting apparatus 11 in a preferable example of the present invention.

The present invention also provides a light emitting apparatus using the aforementioned phosphor particle group in accordance with the present invention. More specifically, the light emitting apparatus of the present invention basically includes a light emitting element emitting primary light, and a light converter that absorbs a part of the above-noted primary light and emits secondary light having a wavelength equal to or longer than that of the primary light. The light converter includes the above-noted phosphor particle group in accordance with the present invention. Here, FIG. 2 is a cross-sectional view schematically showing a light emitting apparatus 11 as a preferable example of the present invention. Light emitting apparatus 11 of the example shown in FIG. 2 basically includes a light emitting element 12 and a light converter 13. Light converter 13 includes a plurality of phosphor particles 1. The plurality of phosphor particles 1 constitute the phosphor particle group of the present invention as described above.

The light emitting apparatus of the present invention includes a light converter including the phosphor particle group of the present invention in which the above-noted mean value of the value obtained by dividing the longer particle diameter by the shorter particle diameter is not greater than 1.75. In such a light emitting apparatus in accordance with the present invention, the phosphor particle group of the present invention in which the mean value of the value obtained by dividing the longer particle diameter by the shorter particle diameter is not greater than 1.75 is used, and thus, significant enhancement of brightness is achieved.

In the light emitting apparatus of the present invention as well, it is preferable that the phosphor particles in which the above-noted value obtained by dividing the longer particle diameter by the shorter particle diameter is greater than 1.0 and not greater than 2.0 constitute 60% or more (preferably 80% or more) of the whole phosphor particles of the phosphor particle group. The light emitting apparatus of the present invention provided with the light converter including such a phosphor particle group can efficiently absorb the primary light from the light emitting element and yield white light with high efficiency, excellent color gamut (NTSC ratio) and a good temperature characteristic.

In addition, as described above, in the light emitting apparatus of the present invention as well, it is preferable that the above-noted phosphor particle group with $c \geq 0.3$ and $0.01 \leq a \leq 0.2$ in the general formula (I) is used. In addition, it is preferable that the phosphor particle group in the light emitting apparatus of the present invention has a median diameter in a range of 10-25 µm as described above.

A gallium nitride (GaN)-based semiconductor is used for light emitting element 12 used in light emitting apparatus 11 of the present invention, in terms of efficiency. In light emitting apparatus 11 of the present invention, light emitting element 12 that emits primary light having a peak wavelength in the range of 430-480 nm is used. The use of a light emitting element having a peak wavelength of less than 430 nm reduces contribution of blue component, worsens color rendition, and thus is not practical. On the other hand, the use of a light emitting element having a peak wavelength of greater than 480 nm reduces brightness of white and thus is not practical. In terms of efficiency, light emitting element 12 in light emitting apparatus 11 of the present invention preferably emits primary light in the range of 440-470 nm.

In light emitting apparatus 11 of the present invention in the example shown in FIG. 2, a medium 15 of light converter 13 is not specifically limited as long as light converter 13 contains the above-noted phosphor particle group of the present invention and can absorb a part of primary light emitted from light emitting element 12 and emit secondary light having a wavelength equal to or longer than that of the primary light. For example, epoxy resin, silicone resin, urea resin, or the like may be used as medium (transparent resin) 15, although the present invention is not limited thereto. Light converter 13 may contain any appropriate additive such as $SiO_2$, $TiO_2$, $ZrO_2$, $Al_2O_3$, $Y_2O_3$, as a matter of course, to such an extent that the effect of the present invention is not inhibited.

Light converter 13 of light emitting apparatus 11 of the present invention may include phosphor particles 14 other than the above-mentioned phosphor particle group of the present invention, as shown in the example in FIG. 2, as a matter of course. Other phosphor particle that may be included in light converter 13, other than the phosphor particle group of the present invention, is not specifically limited. However, since the phosphor particle group of the present invention is composed of green light emitting phosphor particles, particles of a divalent europium-activated nitride red light emitting phosphor expressed by the following general formula (II) are suitable, considering that a light emitting apparatus presenting white light by mixing light can be realized.

$(MI_{1-f}Eu_f)MIISiN_3$             General formula (II):

In the general formula (II), MI is an alkaline-earth metal and refers to an element of at least one kind selected from Mg, Ca, Sr, and Ba. Furthermore, in the general formula (II), MII is a trivalent metallic element and refers to an element of at least one kind selected from Al, Ga, In, Sc, Y, La, Gd, and Lu. Among them, MII is preferably an element of at least one kind selected from Al, Ga, and In, since red light can be emitted even more efficiently. In addition, in the general formula (II), the value of "f" is $0.001 \leq f \leq 0.10$ and is preferably $0.005 \leq f \leq 0.05$. If the value of "f" is less than 0.001, it may be impossible to obtain sufficient brightness, and if the value of "f" exceeds 0.10, brightness may greatly reduce due to concentration quenching and the like.

Specifically, examples of such a divalent europium-activated nitride red light emitting phosphor are $(Ca_{0.99}Eu_{0.01})SiAlN_3$, $(Ca_{0.97}Mg_{0.02}Eu_{0.01})(Al_{0.99}Ga_{0.01})SiN_3$, $(Ca_{0.98}Eu_{0.02})AlSiN_3$, $(Ca_{0.58}Sr_{0.40}Eu_{0.02})(Al_{0.98}In_{00.2})SiN_3$, $(Ca_{0.999}Eu_{0.001})AlSiN_3$, $(Ca_{0.895}Sr_{0.100}Eu_{0.005})AlSiN_3$, $(Ca_{0.79}Sr_{0.20}Eu_{0.01})AlSiN_3$, $(Ca_{0.98}Eu_{0.02})(Al_{0.95}Ga_{0.05})SiN_3$, and the like, although the present invention is not limited thereto, as a matter of course.

When the above-noted divalent europium-activated nitride red light emitting phosphor is used, the mixture ratio thereof to the phosphor particle group of the present invention in light converter 13 is preferably in the range of 1-35% by weight and more preferably in the range of 5-25% by weight with respect to the phosphor particle group of the present invention, though not being specifically limited.

Light converter 13 in light emitting apparatus 11 of the present invention may include a phosphor particle other than the phosphor particle group of the present invention, excluding the above-noted divalent europium-activated nitride red light emitting phosphor, to such an extent that the effect of the present invention is not inhibited. Furthermore, such a phosphor particle other than the phosphor particle group of the present invention and the above-noted divalent europium-activated nitride red light emitting phosphor may be included additionally in light converter 13, in addition to the phosphor particle group of the present invention and the above-noted divalent europium-activated nitride red light emitting phosphor.

Light emitting apparatus 11 of the present invention can be manufactured by any conventionally-known appropriate technique, and the manufacturing method is not specifically limited. For example, it may be manufactured by mixing the phosphor particle group of the present invention (and a phosphor particle other than the phosphor particle group of the present invention, as necessary) in a sealing material made of thermosetting silicone resin as medium 15, and then sealing in light emitting element 12.

Figure 3:
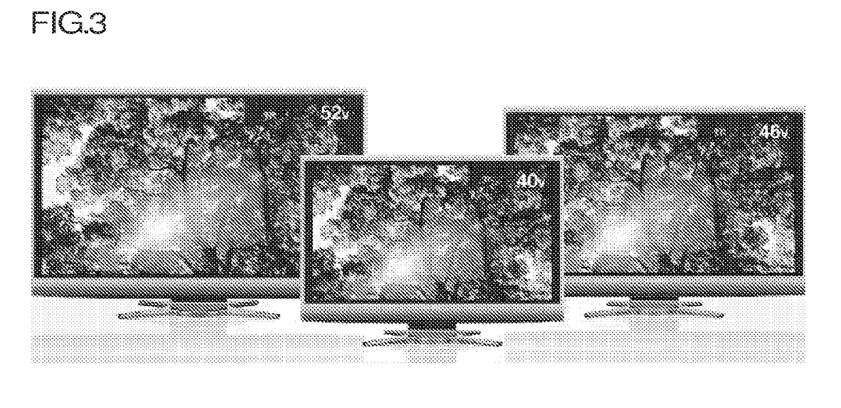
FIG. 3 is a photograph showing an example of a liquid crystal display television using the light emitting apparatus of the present invention.

FIG. 3 is a photograph showing an example of a liquid crystal display television using the light emitting apparatus of the present invention. Above-noted light emitting apparatus 11 of the present invention as shown in FIG. 2 has an extremely stable characteristic (brightness and chromaticity), can efficiently absorb the primary light from the light emitting element, and can yield white light with high efficiency, excellent color gamut (NTSC ratio) and a good temperature characteristic. Light emitting apparatus 11 of the present invention is suitably applicable to a liquid crystal display television having a large LCD such as a thin-screen television. The present invention also provides a liquid crystal display television using such a light emitting apparatus of the present invention.

Although the present invention will be described in more detail taking examples and comparative examples below, the present invention is not limited thereto.

Example 1, Comparative Example 1

A gallium nitride (GaN)-based semiconductor having a peak wavelength of 450 nm was used as a light emitting element. A light converter was produced by using a phosphor particle group, which was a particle group of green light emitting phosphor particles having a composition of $Eu_{0.05}Si_{11.40}Al_{0.60}O_{0.75}N_{15.25}$ (β-type SiAlON) (D50: 15.2  μm), and 85% of which was composed of particles with the value obtained by dividing the longer particle diameter by the shorter particle diameter being greater than 1.0 and not greater than 2.0. It is noted that the phosphor particle group was prepared by controlling the Al concentration (the value of "c" in the general formula (I)) to 0.60. Here, LA-920 (manufactured by HORIBA Ltd.) was used as a particle size distribution measuring equipment. The light converter was fabricated by dispersing the phosphor particle group in a prescribed proportion in a sealing material made of thermosetting silicone resin as a medium and then sealing in a light emitting element. A light emitting apparatus of Example 1 was thus fabricated. Ten thousands of such a light emitting apparatus of Example 1 were fabricated, the brightness and the chromaticity of each light emitting apparatus were measured, and fluctuations in brightness and chromaticity were investigated.

It is noted that the brightness was measured by turning on the light emitting apparatus at forward current (IF) of 20 mA and measuring optical power (photocurrent) from the light emitting apparatus, and the chromaticity was measured by using MCPD-2000 (manufactured by Otsuka electronics Co., Ltd.). On the other hand, a light emitting apparatus of Comparative Example 1 was fabricated in the similar manner as above, except that the phosphor particle group was a particle group of green light emitting phosphor particles having a composition of $Eu_{0.05}Si_{11.90}Al_{0.10}O_{0.10}N_{15.90}$ (β-type SiAlON) (D50: 8.7 μm) and that 35% of the phosphor particle group was composed of particles with the value obtained by dividing the longer particle diameter by the shorter particle diameter being greater than 1.0 and not greater than 2.0. The characteristic was evaluated similarly.

The results of Example 1 and Comparative Example 1 are shown in Table 1. Table 1 shows that the light emitting apparatus of Example 1 has significantly smaller fluctuations in brightness and chromaticity than those of the light emitting apparatus of Comparative Example 1.

TABLE 1

|  | fluctuations in brightness (relative value) | chromaticity point (center value) | fluctuations in chromaticity (Δ) | |
|---|---|---|---|---|
|  |  |  | fluctuations in x value | fluctuations in y value |
| Example 1 | 100~95% | x = 0.250 | 0.010 | 0.011 |
| Comparative Example 1 | 100~83% | y = 0.310 | 0.050 | 0.073 |

Examples 2-7, Comparative Examples 2-7

Light emitting apparatus of Examples 2-7 and Comparative Examples 2-7 were produced in the manner similar to Example 1 except the proportion (%) of particles with the value obtained by dividing the longer particle diameter by the shorter particle diameter being greater than 1.0 and not greater than 2.0, and D50, and the light emitting elements, as shown in Table 2. The results of the characteristic (brightness and chromaticity) measured in the manner similar to Example 1 are also shown in Table 3. Table 3 shows that the light emitting apparatus of Examples 2-7 have significantly smaller fluctuations in brightness and chromaticity than those of the light emitting apparatus of Comparative Examples 2-7.

TABLE 2

|  | proportion of phosphor particles having the value obtained by dividing the longer particle diameter by the shorter particle diameter of greater than 1.0 and not greater than 2.0 | median diameter (D50) | peak wavelength of light emitting element |
|---|---|---|---|
| Example 2 | 90% | 16.6 μm | 440 nm |
| Comparative Example 2 | 40% | 9.5 μm | 440 nm |
| Example 3 | 75% | 18.1 μm | 460 nm |
| Comparative Example 3 | 45% | 8.8 μm | 460 nm |
| Example 4 | 60% | 17.3 μm | 445 nm |
| Comparative Example 4 | 30% | 9.1 μm | 445 nm |
| Example 5 | 80% | 19.6 μm | 470 nm |
| Comparative Example 5 | 38% | 9.5 μm | 470 nm |
| Example 6 | 85% | 23.5 μm | 430 nm |
| Comparative Example 6 | 42% | 8.9 μm | 430 nm |
| Example 7 | 68% | 18.6 μm | 455 nm |
| Comparative Example 7 | 35% | 9.5 μm | 455 nm |

TABLE 3

|  | fluctuations in brightness (relative value) | chromaticity point (center value) | fluctuations in chromaticity (Δ) | |
|---|---|---|---|---|
|  |  |  | fluctuations in x value | fluctuations in y value |
| Example 2 | 100~94% | x = 0.260 | 0.010 | 0.012 |
| Comparative Example 2 | 100~83% | y = 0.320 | 0.052 | 0.076 |
| Example 3 | 100~96% | x = 0.265 | 0.012 | 0.013 |
| Comparative Example 3 | 100~82% | y = 0.370 | 0.049 | 0.073 |
| Example 4 | 100~94% | x = 0.280 | 0.010 | 0.013 |
| Comparative Example 4 | 100~85% | y = 0.375 | 0.051 | 0.076 |
| Example 5 | 100~93% | x = 0.265 | 0.011 | 0.013 |
| Comparative Example 5 | 100~83% | y = 0.405 | 0.052 | 0.077 |
| Example 6 | 100~95% | x = 0.255 | 0.012 | 0.014 |
| Comparative Example 6 | 100~84% | y = 0.285 | 0.049 | 0.075 |
| Example 7 | 100~96% | x = 0.265 | 0.010 | 0.012 |
| Comparative Example 7 | 100~83% | y = 0.355 | 0.053 | 0.080 |

Example 8, Comparative Example 8

A gallium nitride (GaN)-based semiconductor having a peak wavelength of 460 nm was used as a light emitting element. A light converter was produced by using: a phosphor particle group, which was a particle group of green light emitting phosphor particles having a composition of $Eu_{0.25}Si_{11.65}Al_{0.35}O_{0.35}N_{15.65}$ (β-type SiAlON) (D50: 16.2 μm) and, 85% of which was composed of particles with the value obtained by dividing the longer particle diameter by the shorter particle diameter being greater than 1.0 and not greater than 2.0; and a divalent europium-activated nitride red light emitting phosphor having a composition of $(Ca_{0.99}Eu_{0.01})AlSiN_3$ (D50: 12.8 μm). It is noted that the phosphor particle group was prepared by precisely controlling the oxygen concentration.

The light converter was fabricated by dispersing the phosphor particle group and the red light emitting phosphors in a prescribed proportion in a sealing material made of thermosetting silicone resin as a medium and then sealing in a light emitting element. A light emitting apparatus of Example 8 was thus fabricated. Ten thousands of such a light emitting apparatus of Example 8 were fabricated, the brightness and the chromaticity of each light emitting apparatus were measured, and fluctuations in brightness and chromaticity were investigated.

On the other hand, a light emitting apparatus of Comparative Example 8 was fabricated in the similar manner as Example 8, except that the phosphor particle group was a particle group of green light emitting phosphor particles having a composition of $Eu_{0.25}Si_{11.85}Al_{0.15}O_{0.10}N_{15.90}$ (β-type SiAlON) (D50: 8.6 μm) and that 40% of the phosphor particle group was composed of particles with the value obtained by dividing the longer particle diameter by the shorter particle diameter being greater than 1.0 and not greater than 2.0.

For those light emitting apparatus of Example 8 and Comparative Example 8, the characteristic (brightness and chromaticity) was evaluated in the manner similar to Example 1. The results are shown in Table 4. Table 4 shows that the light emitting apparatus of Example 8 has significantly smaller fluctuations in brightness and chromaticity than those of the light emitting apparatus of Comparative Example 8.

TABLE 4

| | fluctuations in | | fluctuations in chromaticity (⊿) | |
|---|---|---|---|---|
| | brightness (relative value) | Tc-duv (center value) | fluctuations in x value | fluctuations in y value |
| Example 8 | 100~94% | 8500K-0.001 | 0.010 | 0.012 |
| Comparative Example 8 | 100~84% | (x = 0.291, y = 0.299) | 0.052 | 0.076 |

Examples 9-19, Comparative Example 9

Figure 4:
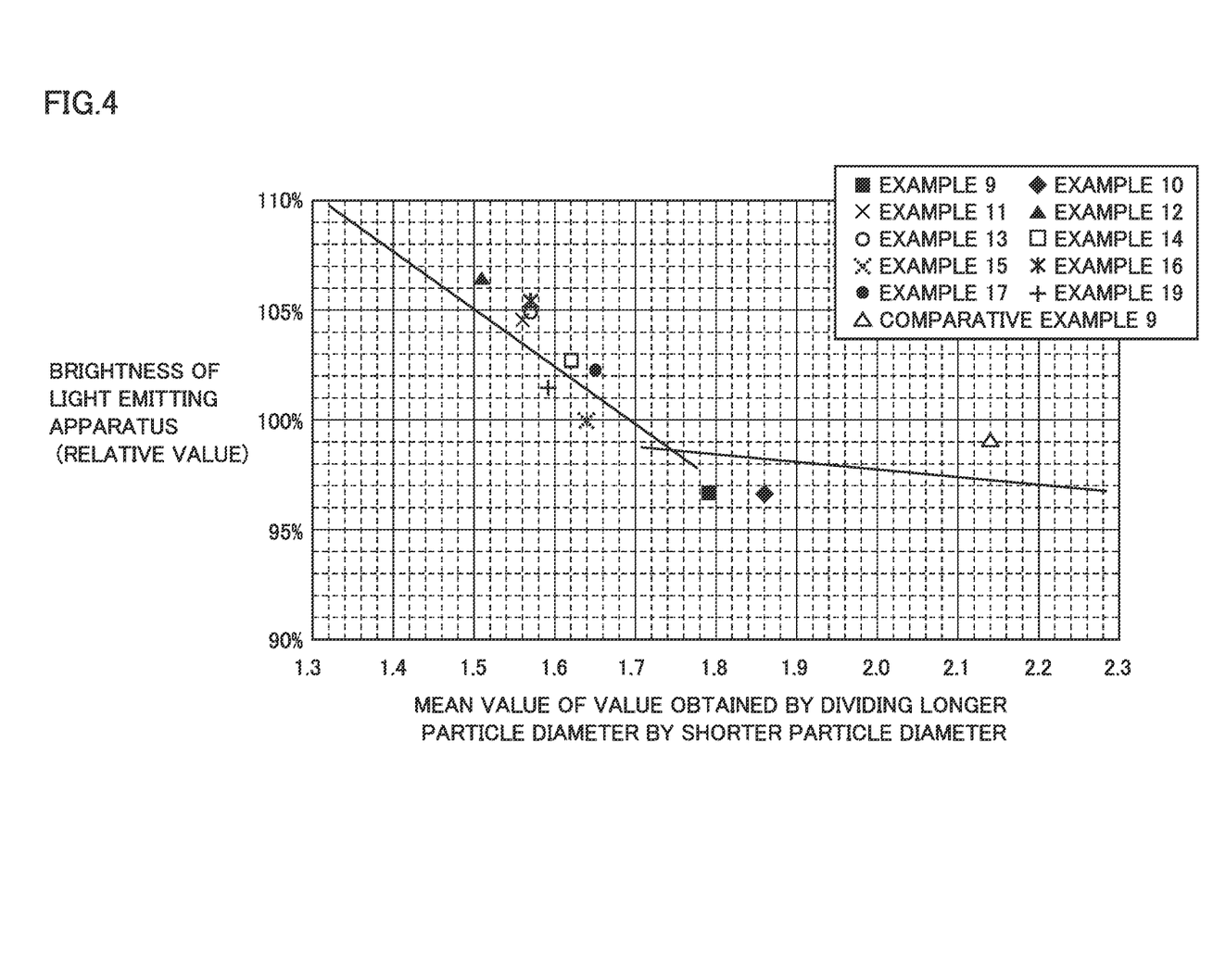
FIG. 4 is a graph showing results of Examples 9-19 and Comparative Example 9, where a vertical axis indicates brightness (relative value) of the light emitting apparatus and a horizontal axis indicates mean value of a value obtained by dividing a longer particle diameter by a shorter particle diameter.

Light emitting apparatus of Examples 9-19 and Comparative Example 9 were produced in the manner similar to Example 1 except that the phosphor particle group having the mean value of the value obtained by dividing the longer particle diameter by the shorter particle diameter and D50 as shown in the following Table 5 was used. The results of the brightness measured in the manner similar to Example 1 are also shown in Table 5. FIG. 4 is a graph showing results of Examples 9-19 and Comparative Example 9, where a vertical axis indicates the brightness (relative value) of the light emitting apparatus and a horizontal axis indicates the mean value of the value obtained by dividing the longer particle diameter by the shorter particle diameter.

TABLE 5

| | mean value of value obtained by dividing longer particle diameter by shorter particle diameter | median diameter (D50) | brightness of light emitting apparatus (relative value) |
|---|---|---|---|
| Example 9 | 1.79 | 19.4 μm | 96.6% |
| Example 10 | 1.86 | 16.1 μm | 96.6% |
| Example 11 | 1.64 | 17.4 μm | 100.0% |
| Example 12 | 1.50 | 17.7 μm | 106.3% |
| Example 13 | 1.57 | 17.2 μm | 104.9% |
| Example 14 | 1.62 | 18.2 μm | 102.7% |
| Example 15 | 1.56 | 16.9 μm | 104.6% |
| Example 16 | 1.57 | 15.5 μm | 105.4% |
| Example 17 | 1.65 | 16.1 μm | 102.2% |
| Example 18 | 1.59 | 17.1 μm | 101.5% |
| Example 19 | 1.57 | 20.2 μm | 101.0% |
| Comparative Example 9 | 2.14 | 17.9 μm | 99.0% |

Table 5 and FIG. 4 show that the light emitting apparatus of Examples 9-19 can achieve significant enhancement of the brightness of the light emitting apparatus when the mean value of the value obtained by dividing the longer particle diameter by the shorter particle diameter is not greater than 1.75.

In Examples 9-19 and Comparative Example 9, PITA-1 (manufactured by Seishin Enterprise Co., Ltd.) was used as the shape distribution measuring instrument of the phosphor particle group and LS-230 (manufactured by Beckman Coulter, Inc.) was used as the particle size distribution measuring equipment. A measurement value obtained by LS-230 well matches a measurement value obtained by LA-920, and the influence of a difference between the two devices is almost negligible.

It is noted that the green light emitting phosphor particles having a composition of $Eu_{0.05}Si_{11.40}Al_{0.60}O_{0.75}N_{15.25}$ is used as the light converter in the above examples. However, when the Al concentration (a value of "c" in the general formula (I)) is greater than 0.3 in the β-type SiAlON represented by the general formula (I): $Eu_aSi_bAl_cO_dN_e$, where 0.005≤a≤0.4, b+c=12, d+e=16, a light emitting apparatus having small fluctuations in brightness and chromaticity can be obtained with comparative ease. Examples of the phosphor other than the above-noted phosphor are specifically $Eu_{0.05}Si_{11.50}Al_{0.50}O_{0.30}N_{15.70}$, $Eu_{0.10}Si_{11.00}Al_{1.00}O_{0.40}N_{15.60}$, $Eu_{0.30}Si_{9.80}Al_{2.20}O_{1.00}N_{15.00}$, $Eu_{0.15}Si_{10.00}Al_{2.00}O_{0.50}N_{15.50}$, $Eu_{0.01}Si_{11.60}Al_{0.40}O_{0.20}N_{15.80}$, $Eu_{0.005}Si_{11.70}Al_{0.30}O_{0.15}N_{15.85}$, $Eu_{0.25}Si_{11.65}Al_{0.35}O_{0.30}N_{15.70}$, $Eu_{0.40}Si_{11.35}Al_{0.65}O_{0.35}N_{15.65}$, and the like.

The embodiment, examples and comparative examples disclosed here should be understood as being illustrative rather than being limitative in all respects. The scope of the present invention is shown not by the foregoing description but by the claims, and it is intended that the equivalency to the claims and all the modifications within the claims should be embraced here.

REFERENCE SIGNS LIST

1 phosphor particle, 11 light emitting apparatus, 12 light emitting element, 13 light converter, 14 phosphor particle other than a phosphor particle group of the present invention, 15 medium

The invention claimed is:

1. A phosphor particle group of divalent europium-activated oxynitride green light emitting phosphor particles each of which is a β-type SiAlON represented by a general formula: $Eu_aSi_bAl_cO_dN_e$, where 0.005≤a≤0.4, b+c=12, d+e=16, wherein a mean value of a value obtained by dividing a longer particle diameter by a shorter particle diameter is not greater than 1.75, and 0.15≤d and c≥0.3 in the general formula.

2. The phosphor particle group according to claim 1, wherein the phosphor particles in which a value obtained by dividing a longer particle diameter by a shorter particle diameter is greater than 1.0 and not greater than 2.0 constitute 60% or more of the whole phosphor particles.

3. The phosphor particle group according to claim 1, wherein the phosphor particles in which a value obtained by dividing a longer particle diameter by a shorter particle diameter is greater than 1.0 and not greater than 2.0 constitute 80% or more of the whole phosphor particles.

4. The phosphor particle group according to claim 1, wherein 0.01≤a≤0.2 in the general formula.

5. The phosphor particle group according to claim 1, wherein the phosphor particle group has a median diameter in a range of 10-25 μm.

6. A light emitting apparatus comprising: a light emitting element of a gallium nitride-based semiconductor emitting primary light having a peak wavelength of 430-480 nm; and a light converter absorbing a part of said primary light to emit secondary light having a wavelength longer than a wavelength of said primary light, said light converter including a phosphor particle group of divalent europium-activated oxynitride green light emitting phosphor particles each of which is a β-type SiAlON represented by a general formula: $Eu_aSi_bAl_cO_dN_e$, where 0.005≤a≤0.4, b+c=12, d+e=16, wherein a mean value of a value obtained by dividing a longer particle diameter by a shorter particle diameter is not greater than 1.75, and 0.15≤d and c≥0.3 in the general formula.

7. The light emitting apparatus according to claim 6, wherein the phosphor particles in which a value obtained by dividing a longer particle diameter by a shorter particle diameter is greater than 1.0 and not greater than 2.0 constitute 60% or more of the whole phosphor particles of said phosphor particle group.

8. The light emitting apparatus according to claim 6, wherein the phosphor particles in which a value obtained by dividing a longer particle diameter by a shorter particle diameter is greater than 1.0 and not greater than 2.0 constitute 80% or more of the whole phosphor particles of said phosphor particle group.

9. The light emitting apparatus according to claim 6, wherein $0.01 \leq a \leq 0.2$ in the general formula.

10. The light emitting apparatus according to claim 6, wherein a median diameter of said phosphor particle group is in a range of 10-25 μm.

11. A liquid crystal display television using the light emitting apparatus as recited in claim 6.

* * * * *

UNITED STATES PATENT AND TRADEMARK OFFICE
CERTIFICATE OF CORRECTION

PATENT NO. : 9,000,664 B2  
APPLICATION NO. : 13/263053  
DATED : April 7, 2015  
INVENTOR(S) : Tetsuya Hanamoto et al.

It is certified that error appears in the above-identified patent and that said Letters Patent is hereby corrected as shown below:

Title page

Item (*) Notice:

Please delete "This patent is subject to a terminal disclaimer."

Signed and Sealed this  
Twenty-third Day of February, 2016

Michelle K. Lee  
*Director of the United States Patent and Trademark Office*